United States Patent [19]

Butt

[11] Patent Number: 5,001,546
[45] Date of Patent: Mar. 19, 1991

[54] CLAD METAL LEAD FRAME SUBSTRATES

[75] Inventor: Sheldon H. Butt, Godfrey, Ill.

[73] Assignee: Olin Corporation, New Haven, Conn.

[21] Appl. No.: 517,592

[22] Filed: Jul. 27, 1983

[51] Int. Cl.$^5$ .................. H01L 23/54; H01L 23/52
[52] U.S. Cl. ......................................... 357/71; 357/67
[58] Field of Search .................. 357/67, 71, 65, 70

[56] References Cited

U.S. PATENT DOCUMENTS

| | | |
|---|---|---|
| 3,381,364 | 5/1968 | Winter . |
| 3,568,301 | 3/1971 | Shibata . |
| 3,684,464 | 8/1972 | Happ et al. . |
| 3,689,684 | 9/1972 | Cox, Jr. et al. . |
| 3,832,769 | 9/1974 | Olyphant, Jr. et al. . |
| 3,999,955 | 12/1976 | Martin et al. . |
| 4,337,089 | 6/1982 | Arita et al. . |
| 4,441,118 | 4/1984 | Fister et al. ............... 357/67 |
| 4,498,121 | 2/1985 | Breedis et al. ............ 361/401 |
| 4,500,028 | 2/1985 | Breedis et al. . |

FOREIGN PATENT DOCUMENTS

| | | | |
|---|---|---|---|
| 913812 | 10/1972 | Canada . | |
| 0042630 | 11/1978 | Japan | 357/67 R |
| 0096665 | 7/1980 | Japan | 357/67 R |
| 0090546 | 7/1981 | Japan | 357/68 |

OTHER PUBLICATIONS

Dance et al., "Clad Metal Circuit Board Substrates for Direct Mounting of Ceramic Chip Carriers", 1st Annual Conference of the International Electronics Packaging Society, Cleveland, Ohio, 1981.
Lassen, "Use of Metal Core Substrates for Leadless Chip Carrier Interconnection", Electronic Packaging and Production, Mar. 1981, pp. 19–104.
"Clad Lead Frames Take Out More Heat" Electronics Review Aug. 1981 pp. 38–39.

Primary Examiner—Rolf Hille
Assistant Examiner—S. V. Clark
Attorney, Agent, or Firm—Gregory S. Rosenblatt; Paul Weinstein

[57] ABSTRACT

An integrated circuit assembly for electrical applications is disclosed. The assembly includes a lead frame formed from a composite structure. The composite structure comprises a substrate formed of a nickel-iron alloy. A cladding is bonded to opposite surfaces of the substrate. The cladding consists essentially of about 15% to about 70% nickel and the balance essentially copper. The resulting lead frame has a coefficient of thermal expansion of about 50 to about 100 in/in/°C. A second embodiment of the integrated circuit assembly also relates to a lead frame formed from a composite structure. The composite structure comprises a substrate formed of a nickel-iron alloy. A cladding material is bonded to opposite surfaces of the substrate for providing the circuit assembly with relatively high electrical and thermal conductivity. A second cladding is bonded to opposite surfaces of the first cladding so that the lead frame has a coefficient of thermal expansion of about 50 to about 100 in/in/°C. and a thermal conductivity of about 30 to 75 B.T.U./ft$^2$/ft/hr/°F.

24 Claims, 1 Drawing Sheet

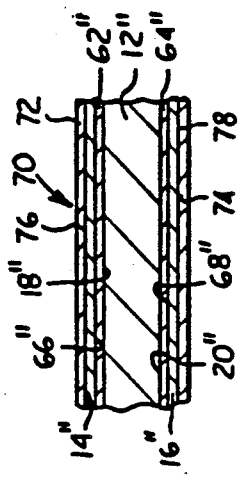
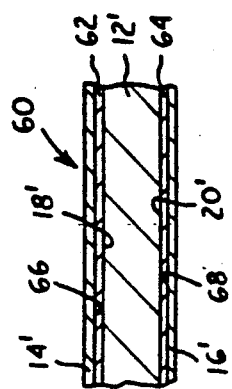
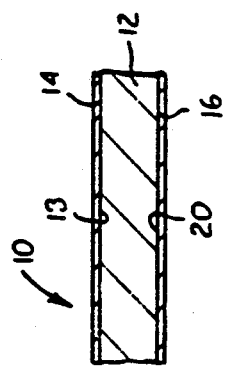
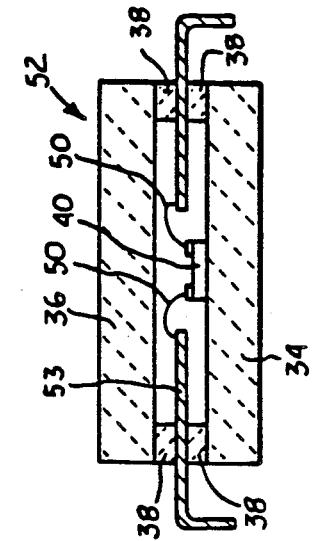
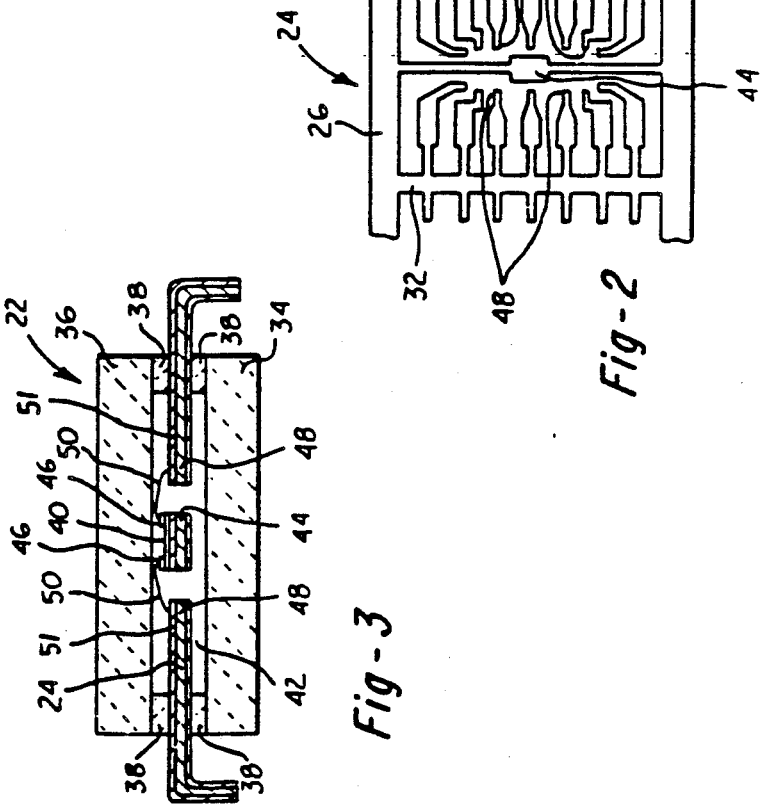
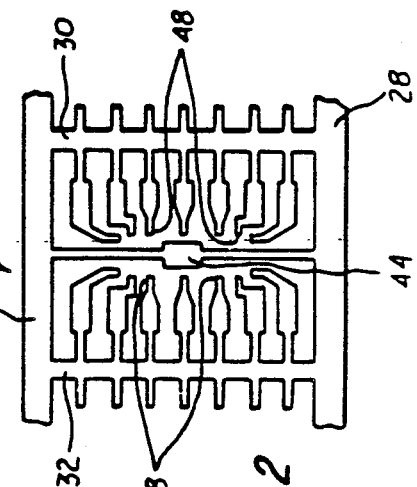

CLAD METAL LEAD FRAME SUBSTRATES

While the invention is subject to a wide range of applications, it is especially suited for use as the lead frame of an integrated circuit assembly and will be particularly described in that connection.

Numerous electronic devices utilize packages containing semiconductor integrated circuits on silicon chips. Often, it is desired to hermetically seal the circuits to increase their life expectancy. The electronics industry is presently using ceramic dual-in-line integrated circuit packages (CERDIP) when a hermetic seal is required. These packages consist of an aluminum-oxide-ceramic substrate and cover placed on either side of a lead frame attached to an integrated circuit chip and sealed together with glass.

The manufacture of these conventional CERDIP packages generally follows the same sequence of operations. First, a suitable glass is applied to an aluminum-oxide-ceramic substrate using any desired technique such as silk screening. The glass is then fused into a homogeneous glass layer which adheres to the aluminum-oxide-ceramic substrate. Either separately or concurrently with the glass application step, a lead frame is partially embedded into a glass layer. Next, a semiconductor chip is affixed to the surface of the substrate by any conventional technique including a gold-silicon eutectic brazing, a lead-base soldering, a glass soldering, or applying a high temperature adhesive. Aluminum lead wires are then ultrasonically bonded to aluminum bonding pads provided on the semiconductor chip and to the lead frame so as to interconnect the chip to the lead frame. Finally, an aluminum-oxide-ceramic cover having a layer of glass adhered thereto, as with the substrate is mounted on the substrate and lead frame. This entire assembly is finally heated to fuse the glass and form a hermetic seal. An alternative CERDIP package uses a lead frame having a pad incorporated therein. The chip is affixed to the lead frame by any suitable mounting means such as solder. Then lead wires are interconnected between the bonding pads on the chip and the lead frame. A preglazed ceramic substrate and preglazed ceramic cover are simultaneously disposed on either side of the lead frame and fused together with glass. The chip is then suspended in the space between the substrate and cover attached to the alumina substrate as described with regards to the previous CERDIP package.

The fundamental design of the CERDIP package is controlled by several factors such as those which follow. The aluminum-oxide-ceramic material used to form the substrate and cover has a relatively low coefficient of thermal expansion. When the metal lead frame having a substantially higher coefficient of thermal expansion is bonded to the ceramic, the resulting mismatch in the thermal expansion coefficients can cause stress failures when a wide operational temperature range is encountered. This problem has been partially bypassed by designing the lead frame of iron-nickel alloys which have a coefficient of thermal expansion that is relatively close to that of the aluminum-oxide-ceramic. This approach does effectively reduce stress failures between the lead frame and the surrounding ceramic. However, it does create several additional problems which must be overcome.

Preferably, the lead wire between the chip and the lead frame can be quickly and easily bonded to both the aluminum metallization or pad on the semiconductor chip and onto the lead frame. In plastic packages, gold wire is customarily used because of its fast bonding speed. However, the sealing temperature of between about 400 and 450° C. required for glass sealing would quickly form gold-aluminum intermetallics between the lead wire and the aluminum metallization or pad. Even if the temperature could be reduced to around 200° C., gold-aluminum intermetallics would form and result in a high risk of CERDIP failure at the brittle bond.

The electronics industry has overcome this problem by bonding aluminum lead wires to the aluminum metallized pad on the chip and onto the lead frame. Unfortunately, ultrasonic bonding generally requires a long process time to attach the aluminum lead wire to the chip and the lead frame. The time factor results in the use of aluminum wire being more expensive than the use of gold wire.

Another consideration in the use of nickel-iron base alloys is the need to place an aluminum pad on the alloy to which the aluminum lead wire can be bonded. The electronics industry commonly provides an aluminum stripe on at least one surface of a nickel-iron alloy core to which the aluminum lead wire is bonded. The stripe may be produced either by vapor deposition or by cladding. One serious disadvantage of the aluminum striped nickel-iron alloy is that the temperature required to anneal and soften the nickel-iron alloy would melt the aluminum stripe. Also, the maximum amount of cold work which can be tolerated by the nickel-iron core is limited by the need to subsequently form or bend the lead frame without fracture. This problem may actually be exacerbated by the processing requirements that the CERDIP lead frames be finally bent along an axis parallel to the direction of rolling. The resulting cold work tolerance requires the bonding of the aluminum to the nickel-iron alloy to be performed at thicknesses only moderately above the final thickness, i.e. about 0.010 in. and the aluminum feed stock to be very thin, i.e. less than about 0.001 in. which creates handling problems. Another disadvantage of aluminum striped nickel-iron alloy is the difficulty in applying solder to these bare nickel-iron alloy portions of the lead frame which were subjected to glass sealing temperatures. Accordingly, it is difficult to attach the completed CERDIP package device to a printed circuit board.

In the past, the concept of cladding an iron-nickel alloy with copper to adjust the coefficient of thermal expansion of the clad material has been applied to circuit boards and suggested for use as heat sinks, frames and covers for alumina substrates. These concepts are described in an article entitled "Clad Metal Circuit Board Substrates for Direct Mounting of Ceramic Chip Carriers" by Dance and Wallace and presented at the 1st Annual Conference of the International Electronics Packaging Society, Cleveland, Ohio, 1981. Also, an article entitled "Use of Metal Core Substrates for Leadless Chip Carrier Interconnection" by Lassen in Electronic Packaging and Production, March 1981, pages 19-104 discusses the latest technology in metal core substrates.

It has been suggested to form lead frames with lead conductors and other electrical components from alloys of nickel, including iron and/or cobalt such as Kovar, and alloys of copper, including phosphor bronze, red brass, beryllium copper, silver copper and cupronickels. U.S. Pat. Nos. 3,568,301 to Shibata, 3,684,464 to Happ et al., 3,689,684 to Cox, Jr. et al., 3,832,769 to Olyphant, Jr. et al., 3,999,955 to Martin et al., 4,337,089 to Arita et al. and Canadian Patent No. 913,812 to Kauffman illustrates various materials that have been used for these electrical components.

U.S. Pat. No. 4,498,121 to Breedis et al. and U.S. Pat. No. 4,441,118 to Fister et al., both relate to copper alloys which are useful for lead frames and other electrical components.

Both U.S. patent application Ser. No. 369,785, (now abandoned), and 390,081, (now abandoned), by Butt disclose an apparatus and process for forming a chip carrier and circuit board which are not adversely affected by thermal cycling.

It is a problem underlying the present invention to provide a lead frame for an integrated circuit assembly which can accommodate substantial thermal cycling.

It is an advantage of the present invention to provide an integrated circuit assembly for electrical applications which substantially reduce the formation of stresses between the metal lead frame and the ceramic substrate and cover due to thermal cycling.

It is a still further advantage of the present invention to provide an integrated circuit assembly for electrical applications which provide improved heat dissipation.

It is a yet further advantage of the present invention to provide an integrated circuit assembly for electrical applications which are relatively inexpensive to manufacture.

Accordingly, there has been provided an integrated circuit assembly for electrical applications. The assembly includes a lead frame formed from a composite structure. The composite structure comprises a substrate formed of a nickel-iron alloy. A cladding is bonded to opposite surfaces of the substrate. The cladding consists essentially of about 15% to about 70% nickel and the balance essentially copper. A second embodiment of the integrated circuit assembly also relates to a lead frame formed from a composite structure. The composite structure comprises a substrate formed of a nickel-iron alloy. A cladding material is bonded to opposite surfaces of the substrate for providing the lead frame with relatively high electrical and thermal conductivity. A second cladding material is bonded to opposite surfaces of the first cladding so that the lead frame has a coefficient of thermal expansion of between 50 to about $100 \times 10^{-7}$ in/in/° C. A third cladding of aluminum is bonded to opposite surfaces of the second cladding to enhance the bondability of the lead frame to an aluminum lead wire.

The invention and further developments of the invention are now elucidated by means of preferred embodiments shown in the drawings:

FIG. 1 is a composite structure formed of a nickel-iron alloy substrate clad with a nickel-copper alloy in accordance with the present invention;

FIG. 2 is a plan view of a conventional lead frame;

FIG. 3 is a cross-sectional view of a conventional CERDIP package with the chip suspended between the substrate and cover and employing a lead frame of the type disclosed in the present invention;

FIG. 4 is a second type of conventional CERDIP package wherein the chip is supported by the substrate and the lead frame is of the type described in the present invention;

FIG. 5 is a second embodiment of the present invention wherein the composite structure has two claddings;

FIG. 6 is a third embodiment of the present invention where the substrate has three claddings.

Referring to FIG. 1, there is illustrated a composite structure 10 characterized by a relatively low coefficient of thermal expansion. The composite comprises a substrate 12 formed of a nickel-iron alloy. Claddings 14 and 16 are bonded to opposite surfaces 18 and 20 of the substrate 12. The cladding is an alloy consisting of about 15 to 70% nickel and the balance essentially copper. The composite structure has a coefficient of thermal expansion between about $50 \times 10^{-7}$ to about $100 \times 10^{-7}$ in/in/° C. in the temperature range of about 30 to about 450° C.

The substrate 12 of the composite structure 10 is a nickel-iron alloy which the electronics industry has found to be particularly useful as lead frame material for CERDIP packages. The iron-nickel alloy exhibits excellent mechanical properties, including high yield and tensile strengths, high modulus of elasticity and excellent elongation characteristics. Preferably, the alloy composition is in the range of about 35% nickel and the balance essentially iron to about 45% nickel and the balance essentially iron. The coefficient of thermal expansion of these alloys is below about $71 \times 10^{-7}$ in/in/° C. For example, 36 nickel-64 iron, commonly called INVAR, has a coefficient of thermal expansion of approximately 0 in/in/° C. while 42 nickel-58 iron, commonly known as 42 nickel alloy, has a coefficient of thermal expansion of about $71 \times 10^{-7}$ in/in/° C. within the temperature range of about 30 to about 450° C. Above this temperature, a phase transformation of the alloy occurs so that it may be unsuitable for incorporation as lead frame material into CERDIP packages. Although nickel-iron alloys are of primary interest in the present invention, it is also within the terms of the present invention to form the substrate 12 from other alloys such as an iron-nickel-cobalt alloy which maintains its coefficient of thermal expansion over a wider range of temperature. The most frequently used alloy of this type is 29% nickel, 70% cobalt, and the balance essentially iron. This latter configuration has a coefficient of thermal expansion of about $53 \times 10^{-7}$ in/in/° C. in the temperature range of about 30 to about 450° C. For reasons described above, alloys having a coefficient of thermal expansion in this range frequently are a source of failures of CERDIP packages being subjected to high temperature cycling. The cause of the failure is the mismatch in thermal expansion coefficient between the substrate metal and the glass seal and/or alumina base and cover. Also, as mentioned above, the typical aluminum striped nickel-iron lead frame can tolerate only a minimum amount of annealing and cold work.

To overcome these problems, a cladding 14 and 16 is bonded to opposite surfaces 18 and 20, respectively, of the substrate 12. The cladding is an alloy consisting essentially of about 15 to about 70% nickel and the balance essentially copper. A more preferred range of the alloy is about 15 to about 40% nickel and the balance essentially copper. A most preferred range of the alloy is about 20 to about 30% nickel and the balance essentially copper. One or more additional elements may be present in the alloys provided they do not interfere with the role of the nickel addition and do not adversely affect other desirable properties. The elements which may be added include zinc, manganese, iron, tin, chromium and molybdenum. These elements may be present in the following levels: up to about 25% zinc; up to about 6% manganese; up to about 1% iron; up to about 1% tin; up to about 3% chromium; and up to about 2% molybdenum. These elements may be chosen to further resist the formation of copper-aluminum intermetallics. As used herein, the percentages described are weight percentages.

The copper-nickel alloy is advantageous to the present invention because of its ability to retard the growth of copper-aluminum intermetallics. In the applications suggested for the present invention, substantial copper-aluminum intermetallics would cause brittle bonds between the aluminum lead wire and the lead frame and ultimately failure of the electronic package. The particular value of the copper-nickel alloy described herein above is further set out in U.S. Pat. No. 457,605.

In accordance with the present invention, the coefficient of thermal expansion of these alloys is in the range of about $150 \times 10^{-7}$ to about $170 \times 10^{-7}$ in/in/° C. in the temperature range of about 30 to about 450° C. The cladding is applied onto the substrate so that the coefficient of thermal expansion of the resulting composite is between about $50 \times 10^{-7}$ to about $100 \times 10^{-7}$ in/in/° C. in the temperature range of about 30 to about 450° C. To accomplish this, each layer of cladding 14 and 16 may comprise between about 5 to about 20% of the thickness of the total composite structure. When the composite metal laminate material is used in integrated circuit assemblies, such as lead frames, the material may have a thickness of about 0.010 inches. However, the present invention may provide the composite with any desired thickness. In the preferred embodiment of the invention, the thickness of cladding depends upon the desired coefficient of thermal expansion of the substrate. For example, if the substrate were formed of INVAR, the cladding would be thicker than if the substrate were formed with 42 nickel. Each of the clad layers must be of substantially the same thickness to prevent thermostatic deflection during temperature cycling. The cladding may be applied using any conventional technique such as, for example, the bonding principle as disclosed in U.S. Pat. No. 3,381,364. The bonding can be accomplished using a substrate and cladding layers of substantial thickness followed by rolling and heat treatment to obtain the desired hardness. Generally, the annealing or heat treating temperature is between about 850° C. to about 1000° C. Since the melting temperature of the nickel-copper is about 1170° C. and the melting temperature of the nickel-iron is about 1450° C, there are no special process problems in annealing the composite. By contrast, this anneal cannot be performed with a conventional aluminum striped nickel-iron alloy because the aluminum has a melting temperature of about 600° C.

The composite structure 10 is particularly useful when incorporated into an integrated circuit assembly 22 of the type shown in FIG. 3. The circuit assembly may include a lead frame 24 formed of the composite 10 which may be of any conventional configuration such as shown in FIG. 2. The specific design of the lead frame is not a part of the present invention. The lead frame configuration shown in FIG. 2 includes support rails 26 and 28 and side bars 30 and 32. After the lead frame is sealed into the integrated circuit assembly 22, illustrated as a CERDIP package therein, the rails and side bars are removed as will be explained hereinbelow.

The integrated circuit assembly 22 is preferably a conventional CERDIP package including an aluminum-oxide-ceramic substrate 34 and aluminum-oxide-ceramic cover 36. A glass or ceramic 38 bonds the substrate 34 to the cover 36 so as to hermetically seal integrated circuit chip 40 within an enclosed space 42.

The glass or ceramic preferably has a low melting temperature and a coefficient of thermal expansion in the range of about $50 \times 10^{-7}$ to about $100 \times 10^{-7}$ in/in/° C. in the temperature range of about 30 to about 450° C. More specifically, the glass is a low melting temperature lead-oxide base glass having a melting temperature in the range of about 350 to about 460° C. The glass may include additives to adjust the coefficient of thermal expansion to the individual applications as required. Table I lists various exemplary glasses which are adapted for use in accordance with this invention.

TABLE I

| Glass Type | Coefficient of Thermal Expansion, in/in/°C. | Sealing Temperature |
|---|---|---|
| Owens-Illinois Corp.[1] No. 5G-95 | $73 \times 10^{-7}$ | 455° C. |
| Owens-Illinois Corp.[1] No. XS1-1190 | $74 \times 10^{-7}$ | 430° C. |

[1]Proprietary composition manufactured by Owens-Illinois Corporation, Toledo, Ohio In manufacturing a CERDIP package 22 of the type illustrated in FIG. 3, a lead frame of the type illustrated in FIG. 2 and similar to those commonly used in plastic dual-in-line packages is incorporated. First, the lead frame 24 is formed from a composite structure of materials in accordance with the description of the composite structure 10. The chip 40 is mounted on the pad 44 by a conventional bonding means such as a gold-silicon eutectic braze, a lead base soldering operation, a glass soldering operation, or application of a high temperature adhesive. Then, bonding pads 46 (usually aluminized) on chip 40 are connected to the appropriate lead tips 48 with lead wires 50. The lead wires are preferably of aluminum wire and may be bonded to the pads 46 and the outermost layer 51 using a conventional technique such as ultrasonic bonding. Then, a preglazed pair of ceramic or glass components 38 of the type described above are placed between the ceramic substrate and ceramic cover 36 and fused into place. Since the melting temperature of the glass is relatively low, and the package has a relatively brief exposure time of less than about 10 minutes and preferably less than 8 minutes at about 400° C., the integrated circuit chip is not adversely affected and intermetallics formed between the aluminum and the copper-nickel base cladding are insufficient to degrade the bond performance.

The thermal dissipation characteristics of the package illustrated in FIG. 3 are somewhat inferior to those of the more conventional CERDIP packages of the type shown in FIG. 4. This is because the chip is suspended in space rather than attached to the moderately conductive alumina substrate. With certain devices and applications, substantial thermal dissipation is not required and, therefore, the thermal dissipation characteristics of this package may be quite acceptable. The primary advantage of the type of package as shown in FIG. 3 is the reduction in processing steps as compared with the number of steps required for more conventional CERDIP package of FIG. 4. The reduction in processing steps provides a significant lowering of manufacturing costs.

Prior to the present invention, the package of FIG. 3 with an aluminum striped nickel-iron alloy lead frame, first required the removal of the aluminum cladding from the area of the lead frame to which the chip was bonded. This step was necessary because of the inability to practically solder or braze to aluminum. Next, this area required electroplating with a metal such as silver or gold in order to solder or braze the chip in place since even the solderability of the nickel-iron is poor. Both of these operations are relatively expensive and their cost has generally inhibited the wide spread use of this package. The copper-nickel alloy cladding of the nickel-iron alloy as taught by the present invention eliminates the need to remove the cladding or to plate the area to which the chip is to be bonded since the copper-nickel itself is solderable. Since the present invention has eliminated the cost of etching and plating and package 22 has fewer processing steps than package 52 of FIG. 4, the final cost of package 22 as shown in FIG. 3 becomes lower than that of the more conventional CERDIP package 52, as shown in FIG. 4. Therefore, this package becomes an attractive alternative to the conventional CERDIP when thermal requirements permit its use.

The more conventional CERDIP package is illustrated in FIG. 4. The numbers to elements which are substantially identical to the elements set out in FIG. 3 remain unchanged. CERDIP package 52 includes an aluminum-oxide-ceramic substrate 34 and cover 36. A glass or ceramic 38 seals the cover to the substrate. A conventional lead frame 53 formed of a unique composite, as described in the present invention, is connected to chip 40 by lead wires 50. In manufacturing the CERDIP package 52, glass or ceramic 38 is applied to the aluminum-oxide-ceramic substrate 34 by any conventional technique such as silk screening. Then, the glass is fused into a homogeneous glass layer adherent to the ceramic substrate. Either separately or concurrently with the glass fusing step, a lead frame 53 is partially embedded in the glass layer. Next, a semiconductor chip 40 is affixed to the surface of the substrate by any conventional handling technique such as gold-silicon eutectic brazing, lead base soldering, glass soldering or applying a high temperature adhesive. Then, aluminum lead wires are ultrasonically bonded to bonding pads 46 on the chip 40 and to the tips 48 of the lead frame in order to electrically interconnect the chip to the lead frame. A cover 36 having a layer of glass 38 fused thereon, as described with regards to substrate 34, is then positioned above the substrate and heated to fuse the two layers of glass together and hermetically seal chip 40 within the package 52.

Referring to FIG. 5, there is illustrated a composite structure 60 characterized by a relatively low coefficient of thermal expansion and a relatively high thermal conductivity. The composite is similar to composite 10 of FIG. 1 and identical elements are designated by primed numerals. The composite comprises a substrate 12' which is a nickel-iron alloy of the type described with regards to the composite structure 10 described hereinabove. Cladding layers 62 and 64 are bonded to opposite surfaces 18' and 20' of substrate 12'. The cladding layers consist of a copper or copper alloy having a conductivity of between about 113 to about 226 B.T.U./ft$^2$/ft/hr/° F. and a preferred range of about 172 to about 226 B.T.U./ft$^2$/ft/hr/° F.

These copper or copper alloy metals, such as, for example, CDA 194 or CDA 151 have a higher conductivity but less strength than the copper-nickel alloy claddings of composite 10. Therefore, cladding layers 14' and 16' are bonded to the surfaces 66 and 68 of the cladding layers 62 and 64, respectively. These outer claddings 14' and 16' are essentially identical with the cladding layers 14 and 16 of the composite 10 and consist essentially of about 15 to about 70% nickel and the balance essentially copper. The thickness of the claddings are determined so that composite structure 60 has a coefficient of thermal expansion of between $50 \times 10^{-7}$ to about $100 \times 10^{-7}$ in/in/° C. at a temperature range of about 30 to about 450° C. and a thermal conductivity of between about 30 to about 75 B.T.U./ft$^2$/ft/hr/° F.

The cladding layers 62, 64, 14' and 16' may be applied using any conventional technique such as the bonding principle of U.S. Pat. No. 3,381,364. Each layer of copper-nickel alloy cladding 14' and 16' may comprise about 5 to about 10% of the thickness of the total composite structure and each layer of copper or copper alloy cladding 62 and 64 may comprise about 20 to about 40% of the thickness of the total composite structure. If the thickness of the layers result in the composite structure having a high coefficient of thermal expansion, then a lower expansivity material such as 36 nickel-54 iron may be used for the substrate 12' in order to obtain the desired coefficient of thermal expansion of the composite. The clad layers of a particular material must be of substantially the same thickness to prevent thermostatic deflection during temperature cycling. For instance, the thickness of cladding layers 62 and 64 must be substantially the same and the thickness of claddings 14' and 16' must be substantially the same.

The composite structure 60 is particularly useful when incorporated as a lead frame into an integrated circuit assembly of the type shown in FIGS. 3 and 4. The laminated composite 60 may be formed into a lead frame of any desired configuration and substituted for lead frames 24 or 53 in FIGS. 3 and 4, respectively. The cladding layers 62 and 64 provide a highly conductive path for heat dissipation from the inside of the circuit assemblies 22 and 52 to the atmosphere or to a connected heat sink (not shown).

Referring to FIG. 6, there is illustrated a composite structure 70 which is also characterized by a relatively low coefficient of thermal expansion and a relatively high thermal conductivity. The composite 70 is similar to the composites 10 and 60 of FIGS. 1 and 5, respectively, and similar components are designated by double primed numbers Composite 70 comprises a substrate 12" formed of a nickel-iron alloy. Cladding layers 62" and 64" are bonded to surfaces 18" and 20" of substrate 12". Layers 62" and 64" are formed of a copper or copper alloy having a thermal conductivity of about 113 to about 226 B.T.U./ft$^2$/ft/hr/° F. as further elaborated hereinabove. Second cladding layers 14" and 16" consist essentially of about 20 to about 70% nickel and the balance essentially copper and are bonded to opposite surfaces 66" and 68" of the first cladding layers 62" and 64", respectively, to insure that the composite structure has a coefficient of thermal expansion in the range of about 50 to about 100 in/in/° C. at a temperature range of about 30 to about 450° C. and a thermal conductivity of between about 30 to about 75 B.T.U./ft$^2$/ft/hr/° F. Then, third cladding layers 72 and 74 are bonded to opposite surfaces 76 and 78 of the second cladding layers 14" and 16", respectively. The third cladding layers are formed of aluminum or aluminum alloy and may enhance the wire bonding of aluminum wire to its surface in specified applications of the type described hereinbelow. Generally, the claddings 72 and 74 comprise aluminum foil.

The cladding layers 62", 64", 14", 16", 72 and 74 may be bonded by using any conventional technique such as the bonding procedure of U.S. Pat. No. 3,381,364 set forth hereinabove. Each layer of the copper-nickel alloy cladding 14" and 16" may comprise about 5 to about 10% of the thickness of the total composite structure. Each layer of copper or copper alloy cladding 62" and 64" may comprise about 20 to about 40% of the thickness of the total composite structure. Further, each layer of the aluminum or aluminum alloy cladding 72 and 74 may comprise about 1 to about 3% of the total composite thickness. If the thickness of the layers result in the composite structure having a high coefficient of thermal expansion, then a lower expansivity material such as the 36 nickel-54 iron may be used for the substrate 12", in order to obtain the desired coefficient of thermal expansion of the composite. The clad layers of each particular material must be substantially the same thickness to prevent thermostatic deflection during temperature cycling. For instance, the thickness of cladding layers 62" and 64" must be substantially the same and the thickness of cladding layers 14" and 16" must be substantially the same. Finally, the thickness of cladding layers 72 and 74 must also be substantially the same.

The composite structure 70 is particularly useful when incorporated into an integrated circuit assembly of the type shown in FIGS. 3 and 4. The composite may be formed into lead frames 24 or 53 having any conventional configuration such as the design illustrated in FIG. 2.

The integrated circuit assemblies combined with the lead frame formed of the composite 70 may be particularly useful to improve the relatively poor solderability of the commonly employed nickel-iron alloys and to simultaneously provide improved thermal and electrical conductivities in conjunction therewith. For example, referring to FIG. 4, the aluminum lead wires 50 may be conveniently bonded using techniques such as ultrasonic bonding to the aluminum cladding layers 72 or 74. At the same time, the lead frame has a coefficient of thermal expansion of between about 50 to about 100 in/in/° C. in a temperature range of about 30 to 450° C. and a thermal conductivity of between about 30 to about 75 B.T.U./ft$^2$/ft/hr/° F. The coefficient of thermal expansion prevents stress failure from mismatch in the thermal expansion coefficient between the lead frame, the alumina cover and base and the glass or ceramic seal. The thermal conductivity dissipates the heat generated within the package. The ends of the lead frame which are external to the package are generally soldered to some other device such as, for example, a printed circuit board Since the outer aluminum cladding does not easily solder, it is convenient to remove the aluminum cladding external to the package This may be accomplished by masking the area or areas of the cladding which it is desired to retain and removing the aluminum by etching from the areas where it is not wanted. It is also within the scope of the present invention to remove the aluminum cladding using any other desired technique.

The patent, patent applications and publications set forth in this application are intended to be incorporated by reference herein.

It is apparent that there has been provided in accordance with this invention a composite and an integrated circuit assembly for electrical applications which satisfy the objects, means, and advantages set forth hereinabove. While the invention has been described in combination with the embodiments thereof, it is evident that many alternatives, modifications, and variations will be apparent to those skilled in the art inlight of the foregoing description. Accordingly, it is intended to embrace all such alternatives, modifications, and variations as fall within the spirit and broad scope of the appended claims.

I claim:

1. A composite structure characterized by a relatively low coefficient of thermal expansion, said composite structure comprising:
   a substrate consisting essentially of about 35 to about 45 wt. % nickel and the balance essentially iron;
   a cladding bonded to opposite surfaces of said substrate for resisting the formation of copper-aluminum intermetallics;
   said cladding consisting essentially of about 15 to about 70 wt. % nickel and the balance essentially copper whereby said composite structure has a coefficient of thermal expansion of between about $50 \times 10^{-7}$ to about $100 \times 10^{-7}$ in/in/° C.; and
   said cladding further comprising two layers each being between about 5 to about 20% of the thickness of the composite structure, each layer having substantially the same thickness to prevent thermostatic deflection during temperature changes.

2. The composite structure of claim 1 further comprising:
   said cladding consisting essentially of about 15 to about 30 wt. % nickel and the balance essentially copper.

3. An integrated circuit assembly for electrical applications, said assembly comprising:
   a lead frame formed from a composite structure;
   said composite structure comprising:
   a substrate consisting essentially of about 35 to about 45 wt. % nickel and the balance essentially iron;
   a cladding bonded to opposite surfaces of said substrate for resisting the formation of copper-aluminum intermetallics; and
   said cladding consisting essentially of about 15 to about 70 wt. % nickel and the balance essentially copper whereby said composite structure has a coefficient of thermal expansion of between about $50 \times 100^{-7}$ to about $100 \times 10^{-7}$ in/in/° C.; and
   said cladding comprising two layers each being between about 5 to about 20% of the thickness of the composite structure, said layers each having substantially the same thickness to prevent thermostatic deflection during temperature changes.

4. A composite structure characterized by a relatively low coefficient of expansion and a relatively high electrical and thermal conductivity, said composite structure comprising:
   a substrate consisting essentially of about 35 to about 45 wt. % nickel and the balance essentially iron;
   a first metal cladding bonded to opposite surfaces of said substrate for providing said composite structure with relatively high electrical and thermal conductivity, said first cladding comprising first and second layers each being about 20 to about 40% of the thickness of the composite structure, said first and second layers having substantially the same thickness;
   a second cladding consisting essentially of about 15 to about 70 wt. % nickel and the balance essentially copper bonded to opposite surfaces of said first cladding so that said composite structure has a coefficient of thermal expansion of between about $50 \times 10^{-7}$ to about $100 \times 10^{-7}$ in/in/° C., said second cladding being resistive to the formation of copper-aluminum intermetallics, said second cladding further comprising third and fourth layers each being about 5 to about 10% of the thickness of the composite structure, and said third and fourth layers having substantially the same thickness to prevent thermostatic deflection during temperature changes.

5. The composite structure as in claim 4 wherein said first cladding consists essentially of a copper or copper alloy having a thermal conductivity of between about 113 to about 226 B.T.U./ft²/ft/hr/° F.

6. The composite structure as in claim 5 wherein said composite structure has a thermal conductivity of between about 30 to about 75 B.T.U./ft²/ft/hr/° F.

7. An integrated circuit assembly for electrical applications, said assembly comprising:
a lead frame formed from a composite structure;
said composite structure comprising:
a substrate consisting essentially of about 35 to about 45 wt. % nickel and the balance essentially iron;
a first metal cladding bonded to opposite surfaces of said substrate for providing said composite structure with relatively high electrical and thermal conductivity, said first cladding further comprising first and second layers each being about 20 to about 40% of the thickness of the composite structure, and said first and second layers having substantially the same thickness;
a second cladding consisting essentially of about 15 to about 70 wt. % nickel and the balance essentially copper bonded to opposite surfaces of said first cladding so that said composite structure has a coefficient of thermal expansion of between about $50 \times 10^{-7}$ to about $100 \times 10^{-7}$ in/in/° C., said second cladding being resistive to the formation of copper-aluminum intermetallics, said second cladding comprising third and fourth layers each being about 5 to about 10% of the thickness of the composite structure, and said third and fourth layers having substantially the same thickness to prevent thermostatic deflection during temperature changes.

8. The circuit assembly as in claim 7 wherein said first cladding consists essentially of a copper or copper alloy having a thermal conductivity of between about 113 to about 226 B.T.U./ft²/ft/hr/° F.

9. The circuit assembly as in claim 8 wherein said composite structure has a thermal conductivity of between about 30 to about 75 B.T.U./ft²/ft/hr/° F.

10. A composite structure characterized by a relatively low coefficient of expansion and a relatively high electrical and thermal conductivity, said composite structure, comprising:
a substrate consisting essentially of about 35 to about 45% nickel and the balance essentially iron;
a first metal cladding bonded to opposite surfaces of said substrate for providing said composite structure with relatively high electrical and thermal conductivity, said first cladding comprising first and second layers each being about 20 to about 40% of the thickness of the composite structure, and said first and second layers having substantially the same thickness;
a second cladding consisting essentially of about 15 to about 70 wt. % nickel and the balance essentially copper bonded to opposite surfaces of said first cladding so that said composite structure has a coefficient of thermal expansion of between about $50 \times 10^{-7}$ to about $100 \times 10^{-7}$ in/in/° C., said second cladding comprising third and fourth layers each being about 5 to about 10% of the thickness of the composite structure, said third and fourth layers having substantially the same thickness to prevent thermostatic deflection during temperature changes; and
a third cladding consisting essentially of aluminum or aluminum alloy bonded to opposite surfaces of said second cladding.

11. The composite structure as in claim 10 wherein said thermal conductivity of said composite structure is about 30 to about 75 B.T.U./ft²/ft/hr/° F.

12. The composite structure as in claim 11 wherein said first cladding consists essentially of a copper or copper alloy having a thermal conductivity of between about 113 to about 226 B.T.U./ft²/ft/hr/° F.

13. The composite structure as in claim 12 wherein said third cladding comprises fifth and sixth layers each being about 1 to about 3% of the thickness of the composite structure; and
said fifth and sixth layers having substantially the same thickness.

14. An integrated circuit assembly for electrical applications, said assembly comprising:
a lead frame formed from a composite structure;
said composite structure comprising:
a substrate consisting essentially of about 35 to about 45 wt. % nickel and the balance essentially iron;
a first metal cladding bonded to opposite surfaces of said substrate for providing said composite structure with relatively high electrical and thermal conductivity, said first metal cladding comprising first and second layers each being about 20 to 40% of the thickness of the composite structure, and said first and second layers having substantially the same thickness;
a second cladding consisting essentially of about 15 to about 70 wt. % nickel and the balance essentially copper bonded to opposite surfaces of said first cladding, so that said composite structure has a coefficient of thermal expansion of between about $50 \times 10^{-7}$ to about $100 \times 10^{-7}$ in/in/° C., said second cladding comprising third and fourth layers each being about 5 to about 10% of the thickness of the composite structure, said third and fourth layers having substantially the same thickness; and
said third cladding consisting essentially of aluminum or aluminum alloy bonded to opposite surfaces of said second cladding.

15. The circuit assembly as in claim 14 wherein said thermal conductivity of said composite structure is about 30 to about 75 B.T.U./ft²/ft/hr/° F.

16. The circuit assembly as in claim 15 wherein said first cladding consists essentially of a copper or copper alloy having a thermal conductivity of between about 113 to about 226 B.T.U./ft²/ft/hr/° F.

17. The circuit assembly as in claim 16 wherein said third cladding comprises fifth and sixth layers each being about 1 to about 3% of the thickness of the composite structure; and
said fifth and sixth layers having substantially the same thickness.

18. A package assembly adapted for housing an integrated circuit device, comprising:
a ceramic substrate;

a ceramic cover disposed on said substrate to form said package assembly adapted to house the integrated circuit device;

a lead frame disposed between said ceramic cover and said ceramic substrate;

lead wire connecting said lead frame to said circuit device;

the improvement comprising:

a low melting temperature glass layer fusing said cover, lead frame and substrate together to hermetically seal said package assembly;

said lead frame formed of a composite structure, comprising:

a substrate consisting essentially of about 35 to about 45 wt. % nickel and the balance essentially iron;

a cladding bonded to opposite surfaces of said substrate for resisting the formation of copper aluminum intermetallics, said cladding consisting essentially of about 15 to about 70 wt. % nickel and the balance essentially copper whereby said composite structure has a coefficient of thermal expansion of between about $50 \times 10^{-7}$ to about $100 \times 10^{-7}$ in./in./° C., said cladding further comprising two layers each being between about 5 to about 20% of the thickness of the composite structure, and each having substantially the same thickness to prevent thermostatic deflection during temperature changes.

19. A package assembly adapted for housing an integrated circuit device, comprising:

a ceramic substrate;

a ceramic cover disposed on said substrate to form said package assembly adapted to house the integrated circuit device;

a lead frame disposed between said ceramic cover and said ceramic substrate;

lead wire connecting said lead frame to said circuit device;

the improvement comprising:

a low melting temperature glass layer fusing said cover, lead frame and substrate together to hermetically seal said package assembly;

said lead frame formed of a composite structure, comprising:

a substrate consisting essentially of about 35 to about 45 wt. % nickel and the balance essentially iron;

a first cladding bonded to opposite surfaces of said substrate for providing said composite structure with relatively high electrical and thermal conductivity, said first cladding comprising first and second layers each being about 20 to about 40% of the thickness of the composite structure, and said first and second layers having substantially the same thickness;

a second cladding consisting essentially of about 15 to about 70 wt. % nickel and the balance essentially copper bonded to opposite surfaces of said first cladding so that said composite structure has a coefficient of thermal expansion of between about $50 \times 10^{-7}$ to about $100 \times 10^{-7}$ in./in./° C., said coefficient being matched to the coefficient of thermal expansion of said glass, said second cladding being resistant to the formation of copper-aluminum intermetallics, said second cladding comprising third and fourth layers each being about 5 to about 10% of the thickness of the composite structure, and said third and fourth layers having substantially the same thickness.

20. The package assembly as in claim 19 wherein said first cladding consists essentially of a copper or copper alloy having a thermal conductivity of between about 113 to about 226 B.T.U./ft$^2$/ft/hr/° F.

21. The package assembly as in claim 20 wherein said composite structure has a thermal conductivity of between about 30 to about 75 B.T.U./ft$^2$/ft/hr/° F.

22. A package assembly adapted for housing an integrated circuit device, comprising:

a ceramic substrate a ceramic cover disposed on said substrate to form said package assembly adapted to house the integrated circuit device;

a lead frame disposed between said ceramic cover and said ceramic substrate;

lead wires connecting said lead frame to said circuit device;

the improvement comprising:

a low melting temperature glass layer fusing said cover, lead frame and substrate together to hermetically seal said package assembly;

said lead frame formed of a composite structure, comprising:

a substrate consisting essentially of about 35 to about 45 wt. % nickel and the balance essentially iron;

a first cladding bonded to opposite surfaces of said substrate for providing said composite structure with relatively high electrical and thermal conductivity; said first cladding comprising first and second layers each being about 20 to about 40% of the thickness of the composite structure, and said first and second layers having substantially the same thickness;

a second cladding consisting essentially of about 15 to about 70 wt. % nickel and the balance essentially copper bonded to opposite surfaces of said first cladding, so that said composite structure has a coefficient of thermal expansion of between about $50 \times 10^{-7}$ to $100 \times 10^{-7}$ in./in./° C., said coefficient being matched to the coefficient of thermal expansion of said glass; and a third cladding consisting essentially of aluminum or aluminum alloy bonded to opposite surfaces of said second cladding comprising third and fourth layers each being about t5% to about 10% of the thickness of the composite structure, and said third and fourth layers having substantially the same thickness.

23. The package assembly as in claim 22 wherein said thermal conductivity of said composite structure is about 30 to about 75 B.T.U./ft$^2$/ft/hr/° F.

24. The package assembly as in claim 23 wherein said second cladding consists essentially of a copper or copper alloy having a thermal conductivity of between about 113 to about 226 B.T.U./ft$^2$/ft/hr/° F.

* * * * *